US010567895B2

(12) United States Patent
Lawrence et al.

(10) Patent No.: US 10,567,895 B2
(45) Date of Patent: Feb. 18, 2020

(54) THERMAL MODEL BASED ESTIMATOR (71) Applicant: Cirrus Logic International Semiconductor Ltd., Edinburgh (GB)

(72) Inventors: Jason William Lawrence, Austin, TX (US); Antonio Jesus Diez Elorza, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 16/154,984

(22) Filed: Oct. 9, 2018

(65) Prior Publication Data

US 2019/0110145 A1 Apr. 11, 2019

Related U.S. Application Data

(60) Provisional application No. 62/569,769, filed on Oct. 9, 2017.

(51) Int. Cl.
| | |
|---|---|
| *H03F 1/52* | (2006.01) |
| *H04R 29/00* | (2006.01) |
| *H03F 1/30* | (2006.01) |
| *H03F 3/181* | (2006.01) |
| *H04R 3/00* | (2006.01) |
| *H04R 9/02* | (2006.01) |

(52) U.S. Cl.
CPC ............ *H04R 29/003* (2013.01); *H03F 1/30* (2013.01); *H03F 1/52* (2013.01); *H03F 3/181* (2013.01); *H03F 2200/03* (2013.01); *H03F 2200/447* (2013.01); *H03F 2200/468* (2013.01); *H04R 3/007* (2013.01); *H04R 9/022* (2013.01)

(58) Field of Classification Search
CPC ...... H03G 11/00; H04R 29/003; H04R 3/007; H04R 9/022; H04R 3/002; H04R 9/06; H04R 2499/11; H03F 1/52; H03F 1/30

USPC ........................................................ 381/55, 59
See application file for complete search history.

(56) References Cited

U.S. PATENT DOCUMENTS

| | | | |
|---|---|---|---|
| 2009/0257599 A1* | 10/2009 | Sand Jensen | H03F 1/52 381/55 |
| 2011/0194705 A1 | 8/2011 | Gautama | |
| 2014/0169571 A1 | 6/2014 | Polleros | |

(Continued)

OTHER PUBLICATIONS

Nise, Norman S., Control Systems Engineering, Second Edition, Menlo Park: Addison-Wesley Publishing Company, 1995 pp. 594-596.

*Primary Examiner* — Vivian C Chin
*Assistant Examiner* — Ubachukwu A Odunukwe
(74) *Attorney, Agent, or Firm* — Jackson Walker L.L.P.

(57) ABSTRACT

Embodiments described herein provide a method in a thermal model based estimator and a thermal model based estimator for estimating a temperature of a transducer. The method comprises receiving a first signal wherein the first signal is representative of an impedance across the transducer; receiving an indication of a current across the transducer; determining an estimated thermal power based on the indication of the current and an estimated temperature signal, determining, based on the estimated thermal power, the estimated temperature signal using a thermal model of the transducer comprising states defined by a thermal state vector; comparing the first signal with a second signal derived from the estimated temperature signal; updating the thermal state vector of the thermal model based on the comparison; and; outputting the estimated temperature signal.

24 Claims, 10 Drawing Sheets

(56) References Cited

U.S. PATENT DOCUMENTS

2015/0304772 A1* 10/2015 Risberg ................ H04R 3/007
  381/55
2017/0026767 A1* 1/2017 Macours ................ G01K 7/427

* cited by examiner

THERMAL MODEL BASED ESTIMATOR

TECHNICAL FIELD

Embodiments described herein relate to methods and apparatus for estimating a temperature of a transducer. In particular, the estimate of the temperature of the transducer may be utilized to adjust the input signal to the transducer.

BACKGROUND

Mobile platforms are continually demanding better performance from their transducers, such as louder audio and better sound quality from their sound systems and better haptics performance. The transducers (e.g., including but not limited to speakers and haptics) in these systems can be damaged when they are pushed to their limits. One common failure mode for over-driven transducers (e.g. speakers/haptics) is thermal damage. As an example, for speakers, if the voice coil exceeds a maximum temperature, the glues that hold the voice coil together and connect it to the diaphragm can melt and cause irreparable damage. Speaker protection algorithms are commonly used to drive the speaker to its maximum volume while ensuring it does not exceed its rated limits.

Figure 1:
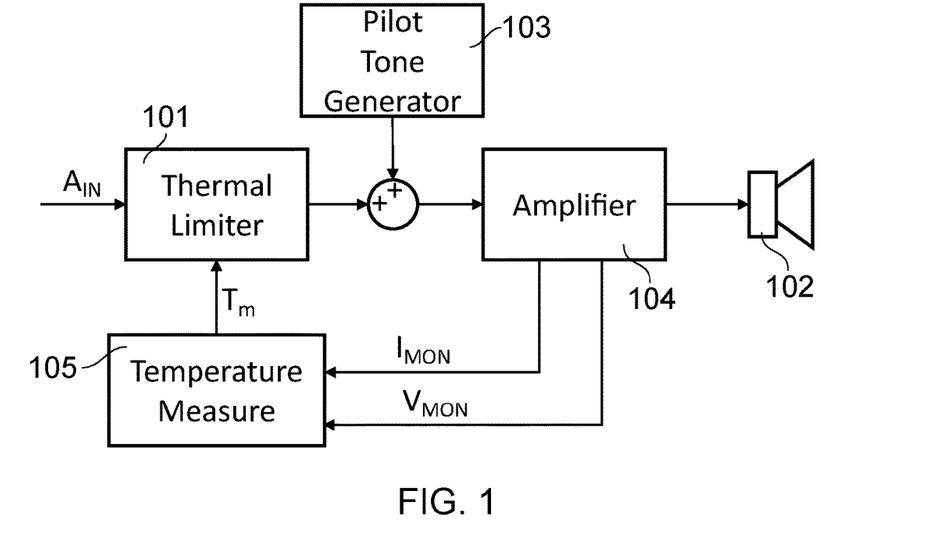
FIG. 1 is an example block diagram showing an approach used in some thermal protection algorithms.

FIG. 1 illustrates an example of an approach used in some thermal protection algorithms (for example, as illustrated in U.S. Patent Publication Numbers 2011/0194705 or US 2014/0169571). The audio input $A_{IN}$ is routed to a thermal limiter 101 that attenuates the audio input $A_{IN}$ based on the temperature of the voice coil in the speaker 102. As the coil temperature increases, the thermal limiter 101 applies an increasing amount of attenuation to ensure the voice coil does not exceed its thermal limit. A low frequency, low-level pilot tone 103 may be added to the input signal to aid in temperature detection as described in the next paragraph.

The input signal $A_{In}$ comprising the pilot tone is routed to the amplifier 104 that drives the speaker. The amplifier 104 also provides a measurement of the speaker voltage, Vmon, and current, Imon. The Imon and Vmon signals may be used to determine a measured temperature, Tm, in temperature measure block 105 which may be used to control the amount of attenuation applied by the thermal limiter 101 to the input signal $A_{IN}$.

Figure 2:
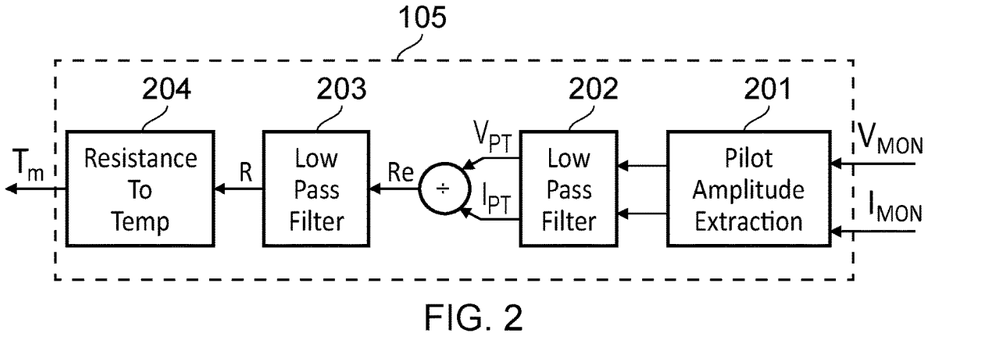
FIG. 2 is an example block diagram implementation of the temperature measurement block in FIG. 1.

FIG. 2 is an example implementation of the temperature measurement block 105. There are many possible variations on this algorithm for extracting a temperature from monitored signals across a transducer, and FIG. 2 illustrates only one possible implementation. First, a pilot tone extraction block 201 extracts the amplitude of the voltage and current signals at the pilot tone frequency. The pilot tone extraction block 201 may therefore be configured to perform, for example, narrow band filtering, a short Fourier transform, or heterodyning. The output of the pilot tone extraction block 201 may then be optionally low pass filtered by filter 202 to reduce noise, although the processes performed by the pilot tone extraction block 201 may involve some inherent low pass filtering. Next, the pilot tone voltage level $V_{PT}$ is divided by the pilot tone current level $I_{PT}$ to yield an estimate, Re, of the direct current (DC) impedance of the transducer. The pilot tone may be set at a frequency where the corresponding transducer impedance is a close approximation of its DC resistance. Again, the estimate, Re, may be optionally low pass filtered by filter 203 to reduce noise. Finally, the calculated resistance R is converted to temperature, $T_m$, by the resistance-to-temperature conversion block 204, using the temperature coefficient associated with the transducer. The accuracy of the measured temperature $T_m$ may be improved by calibrating the system at a known temperature.

As mentioned above, the pilot tone may be chosen at the frequency to ensure the calculation of the DC resistance is sufficiently accurate. In addition, the pilot tone may be selected to be as inaudible as possible, since it may add distortion to the outgoing audio. Typically, these constraints lead the designer to use a low frequency (e.g., <100 Hz), low level (e.g., <30 dB) pilot tone for speakers.

Figure 3:
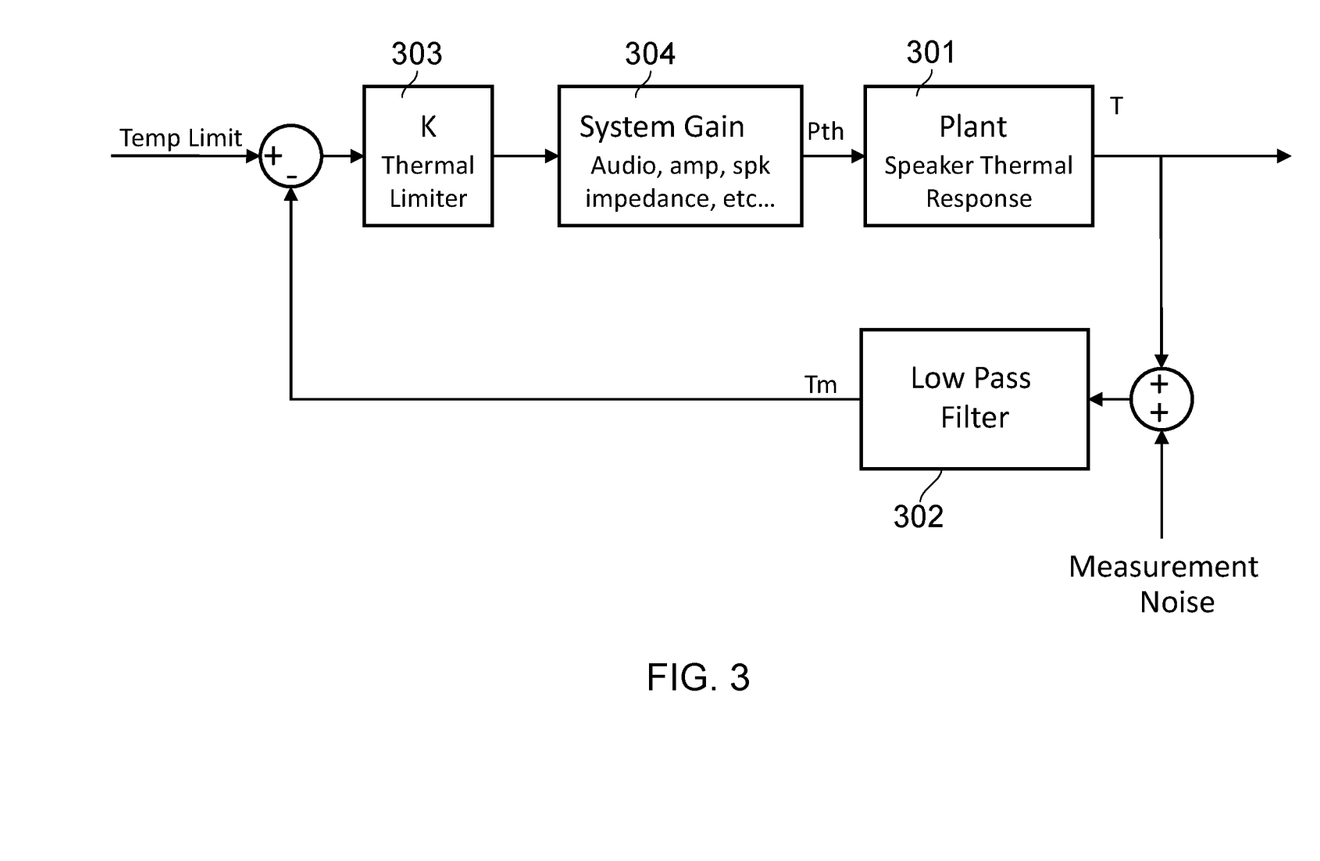
FIG. 3 is an example block diagram illustrating the temperature protection algorithm as a linearized control loop.

Market and industry trends are making it more difficult to design thermal protection algorithms that provide high quality output while protecting transducer. These difficulties may be understood by visualizing the temperature protection algorithm as a linearized control loop, as illustrated in FIG. 3. The plant 301 is the thermal model of the speaker or transducer. The input to the plant 301 is the thermal power $P_{th}$ that heats the transducer and the output of the plant 301 is temperature of the voice coil T. The temperature, T, may not be measured directly; it is instead estimated, for example as described in FIG. 2. The methods for estimating the temperature involve some form of low pass filtering to filter out measurement noise, and to extract the voltage and current amplitude at the pilot tone. This filtering is illustrated by the low pass filter 302. Some measurement noise may originate from the Imon and Vmon Analog-to-Digital Converter (ADC) hardware as well as from numerical noise from the fixed-point implementation of the impedance estimation algorithm. This measurement noise may be included in the input to the temperature estimation, for example, added to the input of the low pass filter 302. The thermal limiter 303 compares this measured temperature $T_m$ to the temperature limit associated with the speaker or transducer, and applies a scaling factor, K, to determine a gain, G, applied to the audio input signal $A_{IN}$. This determined gain will adjust how much thermal power, Pth, is delivered to the speaker along with other gains intrinsic to the system, illustrated in the system gain block 304. In this linearized form, the control scheme is a proportional control loop with some low pass filtering as part of the temperature estimation on the feedback path.

Figure 4A:
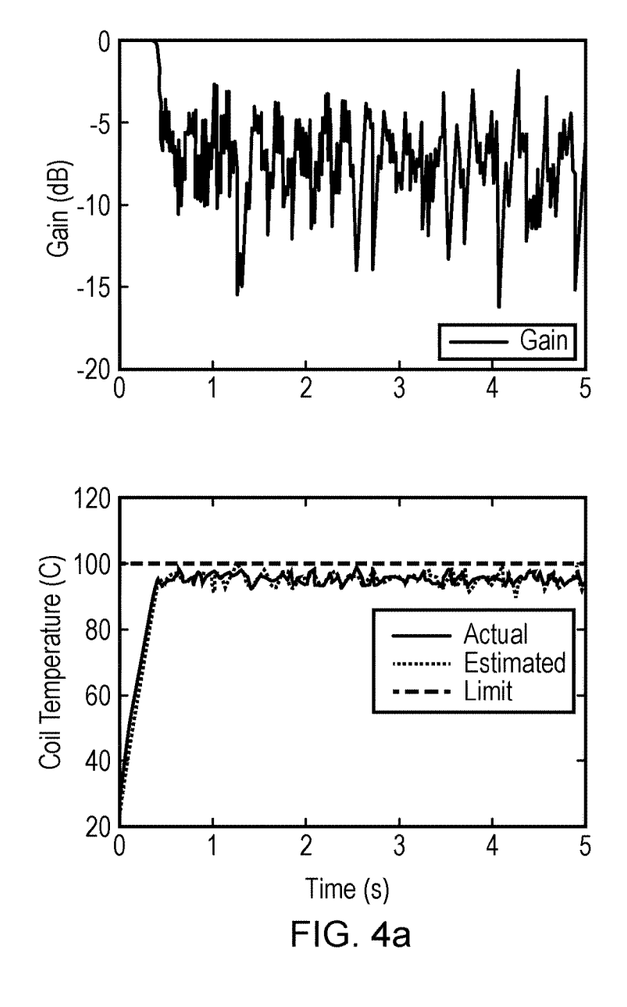
FIG. 4a shows example plots of the results of the temperature protection algorithm of FIG. 3 when there is too little filtering applied.

The design of the low pass filter used to estimate the temperature, in FIG. 3, may be critical to achieving good performance from the control loop. Too much or too little filtering may yield unacceptable results. For example, FIG. 4a illustrates the results when there is too little filtering applied (i.e., cutoff frequency is too high). FIG. 4a shows a simulation of the thermal protection closed loop response when a full-scale heating tone (e.g., 4 kHz) is applied with a thermal limit of 100° C. The top plot shows the applied gain from the thermal limiter 303, and the bottom plot shows the actual and estimated coil temperature. From the bottom plot, it can be seen that the estimated temperature in this example is very noisy. This noise causes excessive gain fluctuation from the thermal limiter 303, as shown in the top plot. This excessive gain fluctuation may result in an unacceptable level of audible distortion.

Figure 4B:
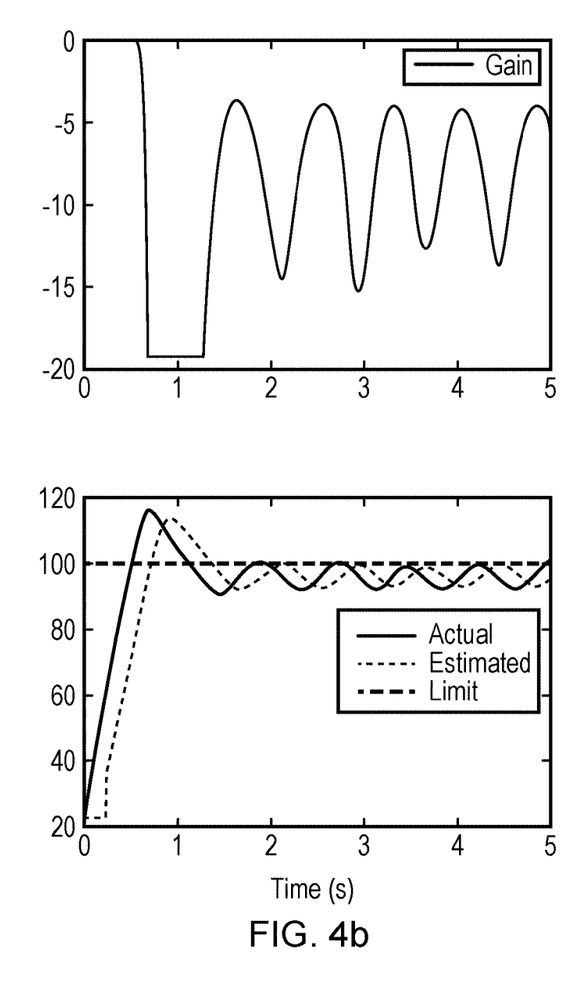
FIG. 4b shows example plots of the results of the temperature protection algorithm of FIG. 3 when there is too much filtering applied.

FIG. 4b illustrates an example of the results when there is too much filtering applied (i.e., cutoff frequency is too low). In this case, the estimated temperature is smooth but has too much delay, as seen in the bottom plot of FIG. 4b. Excessive delay in the feedback path may cause a degradation in phase margin or, equivalently, a reduction in damping ratio (see Nise, Norman S., "*Control Systems Engineering*" Menlo Park: Addison-Wesley Publishing Company, 1995 pp 594-596). Such degradation/reduction can cause overshoot and excessive ringing in the response, as seen in FIG. 4b. Such a response may be unacceptable because the overshoot goes well above the temperature limit, and ringing also creates an undesirable pumping effect in the audio levels. A well-designed thermal limiter 303 may therefore have a balance between too much and too little low pass filtering. However, market and industry demands are pushing toward an increase in the measurement noise and/or a reduction in phase margin (stability).

Lower amplitudes are being requested to reduce the amount of direct or intermodulation distortion introduced by the pilot tone frequency. A lower amplitude pilot level also increases the usable excursion range of transducer, for example, leading to a potential increase in sound pressure level (SPL) or acceleration for a haptic transducer. However, lower amplitude pilot tones decrease the signal-to-noise ratio (SNR) of the measured temperature $T_m$. Such an SNR decrease may cause an effective increase in the Measurement Noise illustrated in FIG. 3, thereby reducing the accuracy of the measured temperature $T_m$.

A demand for louder output levels and more dynamic range have driven a new generation of boosted amplifiers with increased voltage outputs. Such increased voltage outputs correlate to the speaker heating up faster, making the system more sensitive to delays from the low pass filter 302. The reason for the higher sensitivity to delays is that the higher system gain 304 in the forward path causes a reduction in phase margin.

There is also a demand for smaller integrated circuits. The size and cost of Analog-to-Digital converters (ADCs) can be reduced by reducing the requirements on their resolution. However, a lower resolution ADC will increase the measurement noise on the temperature estimate $T_m$.

SUMMARY

According to some embodiments there is therefore provided a method, in a thermal model based estimator, for estimating a temperature of a transducer. The method comprises receiving a first signal wherein the first signal is representative of an impedance across the transducer; receiving an indication of a current across the transducer; determining an estimated thermal power based on the indication of the current and an estimated temperature signal, determining, based on the estimated thermal power, the estimated temperature signal using a thermal model of the transducer comprising states defined by a thermal state vector; comparing the first signal with a second signal derived from the estimated temperature signal; updating the thermal state vector of the thermal model based on the comparison; and outputting the estimated temperature signal.

A thermal model based estimator, for estimating a temperature of a transducer. The thermal model based estimator comprises a first input configured to receive a first signal wherein the first signal is representative of an impedance across the transducer; a second input configured to receive an indication of a current across the transducer; a determination block configured to determine an estimated thermal power based on the indication of the current and an estimated temperature signal, a thermal model block configured to determine, based on the estimated thermal power, the estimated temperature signal using a thermal model of the transducer comprising states defined by a thermal state vector; a comparison block configured to compare the first signal with a second signal derived from the estimated temperature signal, and update the thermal state vector of the thermal model based on the comparison; and an output configured to output the estimated temperature signal.

BRIEF DESCRIPTION OF THE DRAWINGS

For a better understanding of the embodiments of the present disclosure, and to show how it may be put into effect, reference will now be made, by way of example only, to the accompanying drawings, in which.

DESCRIPTION

The description below sets forth example embodiments according to this disclosure. Further example embodiments and implementations will be apparent to those having ordinary skill in the art. Further, those having ordinary skill in the art will recognize that various equivalent techniques may be applied in lieu of, or in conjunction with, the embodiment discussed below, and all such equivalents should be deemed as being encompassed by the present disclosure.

As previously discussed, there are difficulties in designing a low pass filter for the measured temperature that achieves both good noise immunity and an acceptable phase margin. Embodiments of the present disclosure provide systems and methods for estimating a temperature of a transducer. In particular, a thermal model based estimator is used, where a current state of the system, i.e. the system taking the input audio signal to the transducer, is estimated based on the values of previous states in the system. This estimate of a current state, for example the current value of the voltage across the transducer, or the current value of the temperature of the transducer, is compared to a measurement to adjust the thermal model and subsequently generates an output estimated temperature.

Figure 5:
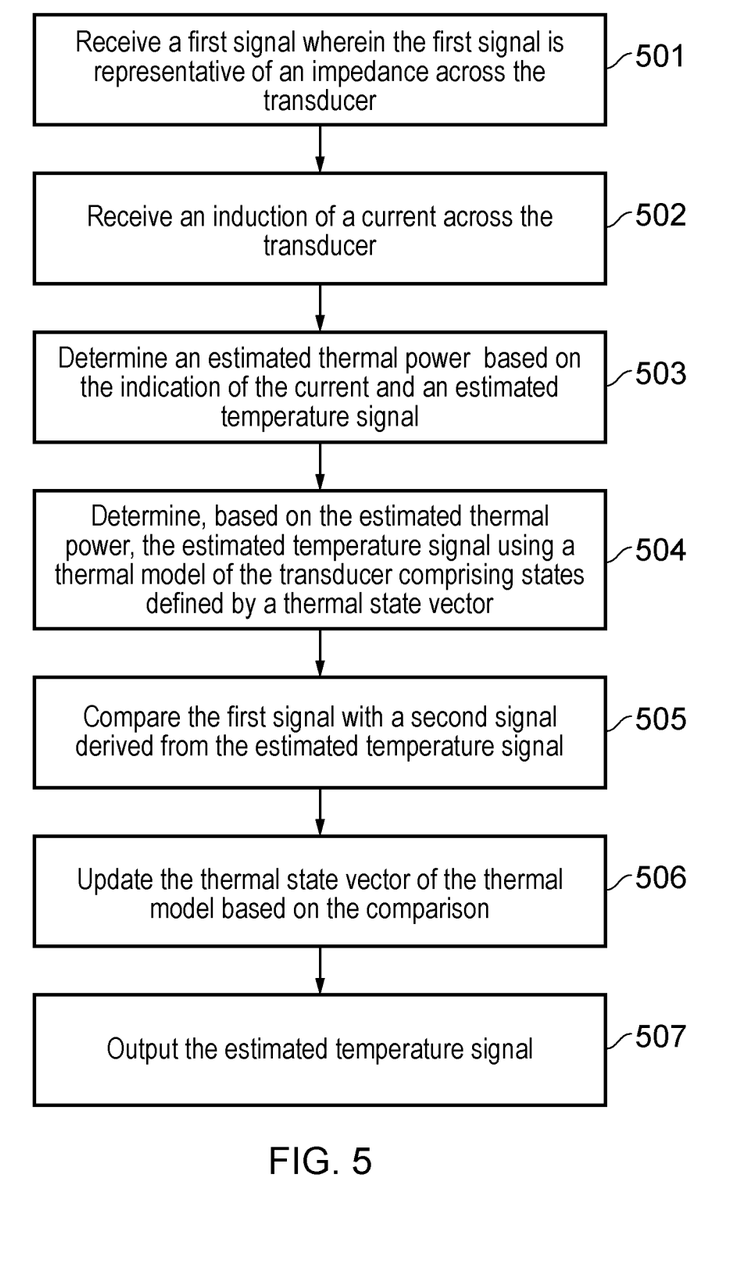
FIG. 5 is an example flow chart that shows a method performed by a thermal model based estimator for estimating the temperature of a transducer in accordance with embodiments described herein.

FIG. 5 is an example flow chart illustrating a method in a thermal model based estimator for estimating a temperature of a transducer. The transducer may comprise a speaker or any other suitable transducer such as a haptic transducer.

In step 501, the thermal model based estimator receives a first signal wherein the first signal is representative of an impedance across the transducer.

In some examples, the first signal comprises a measured temperature of the transducer $T_m$, which may be filtered by a first low pass filter as illustrated in FIG. 2. An example of an embodiment in which the first signal comprises a measured temperature of the transducer is explained in more detail with reference to FIGS. 6, 7 and 8.

In some examples, the first signal comprises a measured voltage $V_{MON}$ across the transducer, which may be measured by an amplifier as illustrated in FIG. 2. An example of an embodiment in which the first signal comprises a measured voltage, $V_{MON}$ across the transducer is explained in more detail with reference to FIGS. 9 and 10. In some examples, the first signal may comprise a low pass filtered version of the measured voltage.

In step 502, the thermal model based estimator receives an indication of a current across the transducer. The indication of the current, $I_{MON}$ across the transducer may be measured by an amplifier as illustrated in FIG. 2.

In step 503, the thermal model based estimator determines an estimated thermal power $P_{the}$ based on the indication of the current $I_{MON}$ and an estimated temperature signal $T_E$. The estimated temperature signal $T_E$ is the signal that is output by the thermal model based estimator as the estimated temperature. However, this current estimate of the temperature is also used to adjust the model in the generation of the next samples of the estimated temperature $T_E$.

In step 504, the thermal model based estimator determines, based on the estimated thermal power $P_{the}$, the estimated temperature signal $T_E$ using a thermal model of the transducer comprising states defined by a thermal state vector. The thermal state vector comprises the internal sates of a transducer thermal model which are configured to estimate the temperature of the transducer $T_E$ based on the estimated thermal power $P_{the}$.

In step 505, the thermal model based estimator compares the first signal with a second signal derived from the estimated temperature signal $T_E$. For example, in embodiments where the first signal comprises a measured temperature of the transducer, the second signal may comprise an output from a second low pass filter configured to filter the estimated temperature signal $T_E$. In embodiments where the first signal comprises a measured voltage across the transducer, the second signal may comprise an estimate of the voltage Ve across the transducer, which may be estimated based on the indication of the current $I_{MON}$ and the estimated temperature signal $T_E$.

In step 506, the thermal model based estimator updates the thermal state vector of the thermal model based on the comparison.

In step 507 the thermal model based estimator outputs the estimated temperature signal $T_E$. It will be appreciated that the output estimated temperature signal may be input into a thermal limiter, such as the thermal limiter 101 of FIG. 1.

A thermal model based estimator as described above with reference to FIG. 5 may be used to generate an estimated temperature signal $T_E$ that will achieve both good noise immunity and an acceptable phase margin.

In some examples, the thermal model based estimator comprises a Kalman filter. The Kalman filter is a statistically optimal algorithm for generating a linear estimate of an unmeasurable signal, from a set of measured signals. It uses a system model to predict what the unmeasurable signal is, and then corrects that model based on the measured values.

Embodiments described herein provide a thermal model based estimator, and for example, a Kalman filter, which may be implemented to achieve an improved thermal limiter response that may be used to protect a transducer (e.g., speaker, haptic device, etc.). It will however be appreciated that the thermal model based estimator may be implemented in many other ways. For example, the thermal based estimator may alternatively be an observer, for example, a Leuenberger observer or a sliding mode observer. It will also be appreciated that the thermal model based estimator estimates an internal state of the system based on previous states of the system in order to generate an estimate temperature signal $T_E$.

Figure 6:
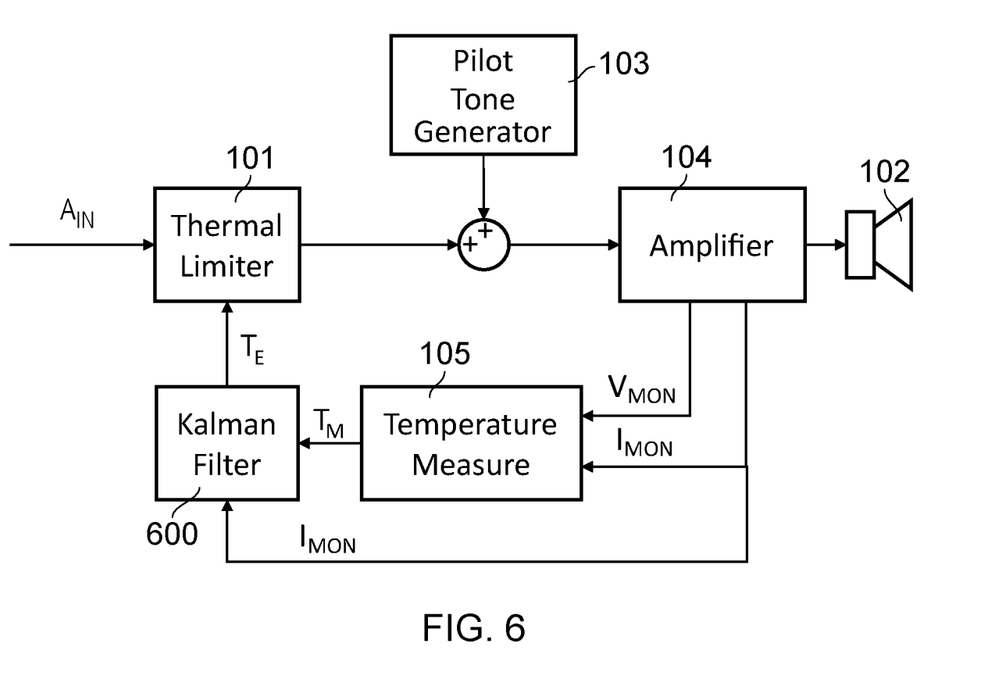
FIG. 6 is an example block diagram showing an embodiment of a thermal model based estimator in which the first signal comprises a measured temperature $T_m$ across the transducer in accordance with embodiments described herein.

FIG. 6 illustrates an embodiment of a thermal model based estimator in which the first signal comprises a measured temperature $T_m$ across the transducer.

In this FIG. 6, similar features to those illustrated in FIG. 1 have been given similar reference numbers. In this example, the measured temperature, $T_m$, is calculated the same way it was previously in FIG. 2. However, rather than going to the thermal limiter 101 directly, this value is input into thermal model based estimator (e.g., such as a Kalman filter) 600 as the first signal, along with the measured current signal $I_{MON}$.

The output of the thermal model based estimator 600 is an estimated temperature signal, $T_E$.

The thermal model based estimator 600 uses internal thermal and system models to anticipate rapid temperature changes as well as to optimally filter out noise from the estimated temperature signal $T_E$.

Figure 7:
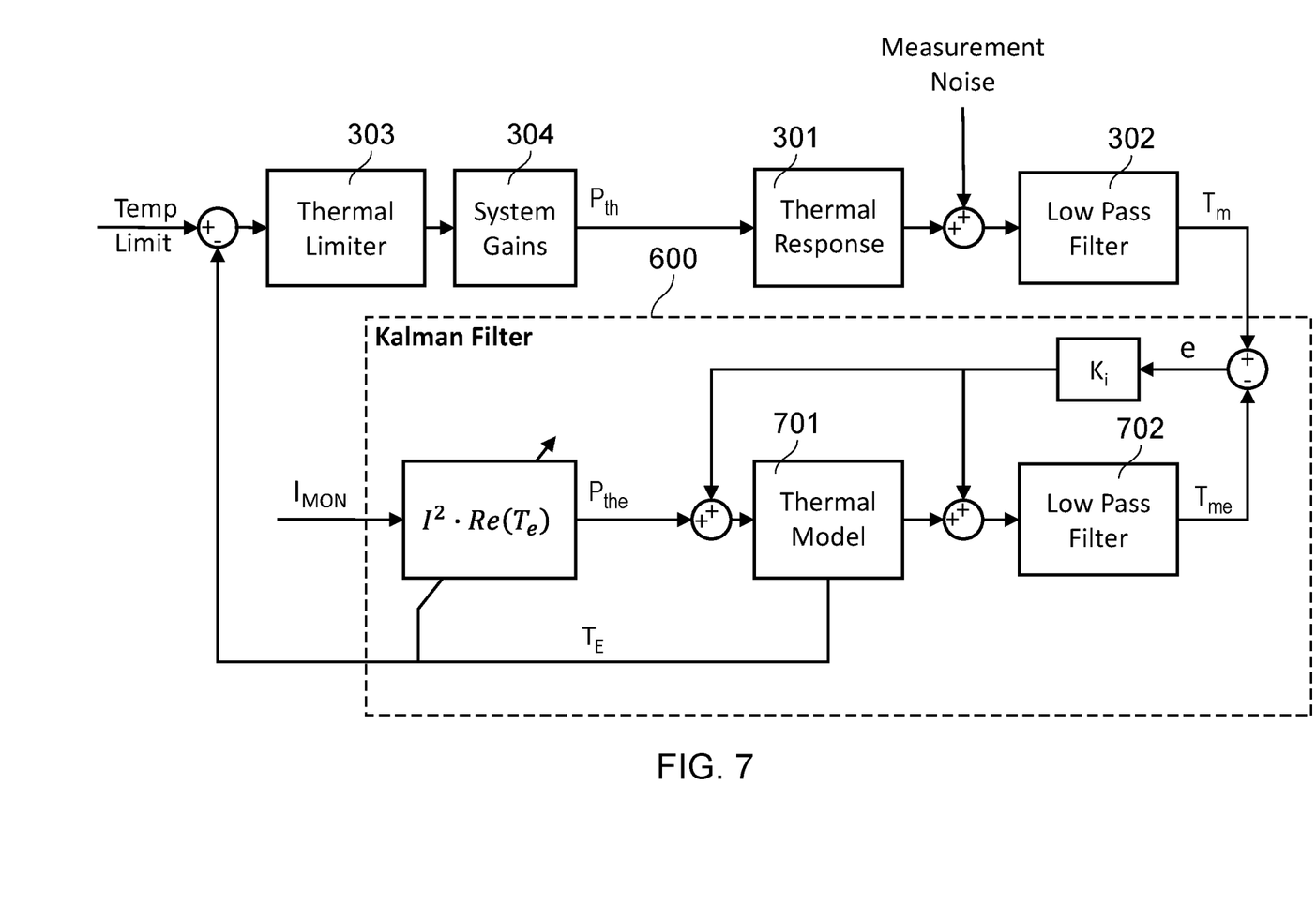
FIG. 7 is an example block diagram showing how the thermal model based estimator may be implemented, for example as a Kalman filter in accordance with embodiments described herein.

FIG. 7 illustrates how the thermal model based estimator 600 may be implemented, for example as a Kalman filter.

The thermal model based estimator 600 uses the estimated thermal power $P_{the}$, a thermal model of the transducer 701 and a process for the measured temperature $T_m$ to provide the estimated temperature signal $T_E$. The top signal path of FIG. 7 describes the system of FIG. 3, but the blocks are re-arranged to help with the explanation.

The thermal model based estimator 600, which in this case is a Kalman filter, comprises thermal model 701 and a second low pass filter 702 that may mirror the speaker thermal response 301 and the first low pass filter 302 used to generate the measured temperature $T_m$.

The low pass filter 702 may operate as the estimated temperature process model for example as illustrated in FIG. 2. The transducer thermal model 701 estimates the actual temperature of the transducer based on the estimated thermal power $P_{the}$. The transducer thermal model 701 effectively filters the measurement noise introduced by the measured current $I_{MON}$ by the thermal model itself and adds little or no extra delay other than that inherent in the system. The second low pass filter 702 mirrors the temperature measurement process, illustrated in FIG. 2, i.e. mirrors the measurement noise and the low pass filter 302. The output of the second low pass filter 702 is therefore an estimated measured temperature, $T_{me}$, which in this example comprises the second signal.

The estimated measured temperature is then compared to the measured temperature, $T_m$, to form an error signal, e. In other words, the estimated measured temperature ($T_{me}$) may be subtracted from the estimated measured temperature ($T_m$) to provide an error signal e.

The error signal e may then be used to adjust the states of the thermal state vector of the thermal model 701. The error signal e may also be used to adjust the states of a filter state vector, describing the second low pass filter 702. The error signal e represents the accuracy of the transducer thermal model and the second low pass filter in mirroring the speaker thermal response 301 and the first low pass filter 302 at the present time. As the first low pass filter 302 and second low pass filter 702 introduce the same delay (because they provide the same filtering), the aim is for the measured temperature and the estimated measured temperature to be the same. If this occurs, the output of the transducer thermal model 701 will be a good estimate of the actual temperature of the speaker without any delay.

Therefore, if the error signal e is large, the transducer thermal model 701 in the thermal model based estimator 600 may be inaccurate and may be corrected. The transducer thermal model 701 may be corrected by multiplying the error e by a set of gains $K_i$ to generate correction factors, and these correction factors may be added to the internal states of a thermal state vector describing the transducer thermal model 701. Equivalently, the second filtering block 702 may also be an inaccurate model, and similarly the correction factors may be added to the internal states of the filter state vector describing the second filtering block 702.

This internal feedback process is constantly working to reduce the error signal e and keeps the Kalman filter's internal models in good alignment with the real system. The estimated temperature signal $T_E$ is output from the transducer thermal model 701 and used by the thermal limiter 303. As the transducer thermal model 701 introduces minimal delay (especially compared to the temperature measurement block illustrated in FIG. 2), this estimated temperature $T_E$ is not delayed compared to the actual temperature T of the transducer (output from the thermal response 301), and the noise is reduced by the transducer thermal model 701.

The transducer thermal model 701 used in FIG. 7 may be based on any number of models given in the literature. The transducer thermal model may comprise any order model, for example $2^{nd}$ or $3^{rd}$ order lumped thermal models as equivalent electrical circuits with resistors and capacitors. The transducer thermal model 701 may comprise a nonlinear thermal model that accounts for convection, positional dependent thermal resistance, and self-heating due to Eddy currents. Implementation of this thermal model may also require an additional excursion and velocity model of the speaker (not shown). The order and complexity of the transducer thermal model 701 may depend on the particular application and its accuracy requirements.

The transducer thermal model 701 is driven by the estimated thermal power $P_{the}$ into the transducer (e.g., speaker, haptic, etc.). The thermal power into the transducer may not be directly measured. Instead, it may be estimated as:

$$P_{the} = I_{MON}^2 Re(T_E)$$

where Re is the estimated transducer resistance as a function of the estimated temperature signal $T_E$, and $I_{MON}$ is the measured current. In FIG. 7, the estimated direct current (DC) resistance Re will change as the transducer heats up, which may be updated directly from the estimated temperature signal $T_E$ output by the transducer thermal model 701.

Therefore, when the error signal e is large, the transducer thermal model 701 is altered a significant amount, which causes a large change in the estimated temperature $T_E$. This estimated temperature $T_E$ is fed back to cause a change in the estimated thermal power $P_{the}$, which is then fed into the transducer thermal model 701.

In the following, it is shown how the Kalman filter 600 from FIG. 7 may be implemented in state space form. The algorithm is a recursive set of equations for generating the estimated temperature signal $T_E$ given the measured temperature, $T_m$, and measured current, $I_{MON}$.

Equation (1) shows the state update equation for the thermal model and low pass filter:

$$x_{i+1} = F \cdot x_i + B \cdot P_{thei} + K_i \cdot (T_{mi} - T_{mei})$$

where the "i" variable represents the current time index. The total state vector, $$x_i = \begin{bmatrix} x_{th} \\ x_{LPF} \end{bmatrix}$$

contains the thermal state vector $x_{th}$ and the filter state vector $x_{LPF}$. The model is driven by the estimated input power $P_{thei}$, which is calculated in the previous step. The states are updated according to the F and B matrices where $$F = \begin{bmatrix} F_{th} & 0 \\ F_c & F_{LPF} \end{bmatrix}, \text{ and } B = \begin{bmatrix} B_{th} \\ 0 \end{bmatrix}.$$

The F and B matrices are partitioned into the thermal model components $F_{th}$ and $B_{th}$, and low pass filter component $F_{LPF}$. The $F_c$ matrix connects the thermal model states to the low pass filter. The Kalman gain $K_i$ multiplies the error between the measured temperature $T_{mi}$ and the Kalman filter's estimate of the measured temperature $T_{mei}$. The estimate of the measured temperature $T_{mei}$ may be calculated from the current state using the following equation:

$$T_{mei} = [0 \, H_{LPF}] \cdot x_i$$

$$H = [0 \, H_{LPF}]$$

The estimated thermal power $P_{thei}$ may be calculated from:

$$T_{Ei} = [H_{th} \, 0] \cdot x_i$$

$$Re_i = [T_{Ei} - T_0] = R_0 \alpha + R_c$$

where $T_{Ei}$ is the current value of the estimated temperature signal, $R_0$ is the calibration resistance of the transducer, $T_0$ is the calibration temperature of the transducer, α is the temperature coefficient of the transducer, $Re_i$ is the current estimate of the resistance of the transducer, and $I_{MON}$ is the measured transducer current from the amplifier.

In the above equations $F_{th}$, $B_{th}$ and $H_{th}$ along with the thermal state vector $x_{th}$, all are elements of the thermal state space model, which may be derived from any suitable thermal model. Similarly, $F_{LPF}$, $H_{LPF}$ and the filter state vector $x_{LPF}$ comprise the state space model of the second low pass filter 702. In both cases, these models are sub-matrices of suitable dimension and may be derived using standard system modelling techniques. The Kalman filter coefficients may be calculated based on a Kalman gain update. For example:

$$K_i = F \cdot P_i \cdot H^* \cdot (R_0 + H \cdot P_i \cdot H^*)^{-1}$$

$$P_{i+1} = F \cdot P_i \cdot F^* + G \cdot Q \cdot G^* - K_i \cdot (R_0 + H \cdot P_i \cdot H^*) \cdot K_i^*;$$

where the F and H matrices are defined above. The G, Q, and Rv matrices may be chosen by the designer to model the noise in the system. The $P_i$ matrix is the state covariance matrix, and its initial value $P_0$ may also be suitably chosen by the designer. These equations only illustrate one form of the Kalman gain update equation. Other forms may have precision or computational advantages in different situations. Also, the $K_i$ vector of Kalman gains may change over time. The Kalman Filter coefficients may be calculated offline, and the resulting Kalman values stored in memory. Alternatively, the equations may be implemented online to save memory at the cost of computational complexity.

Figure 8:
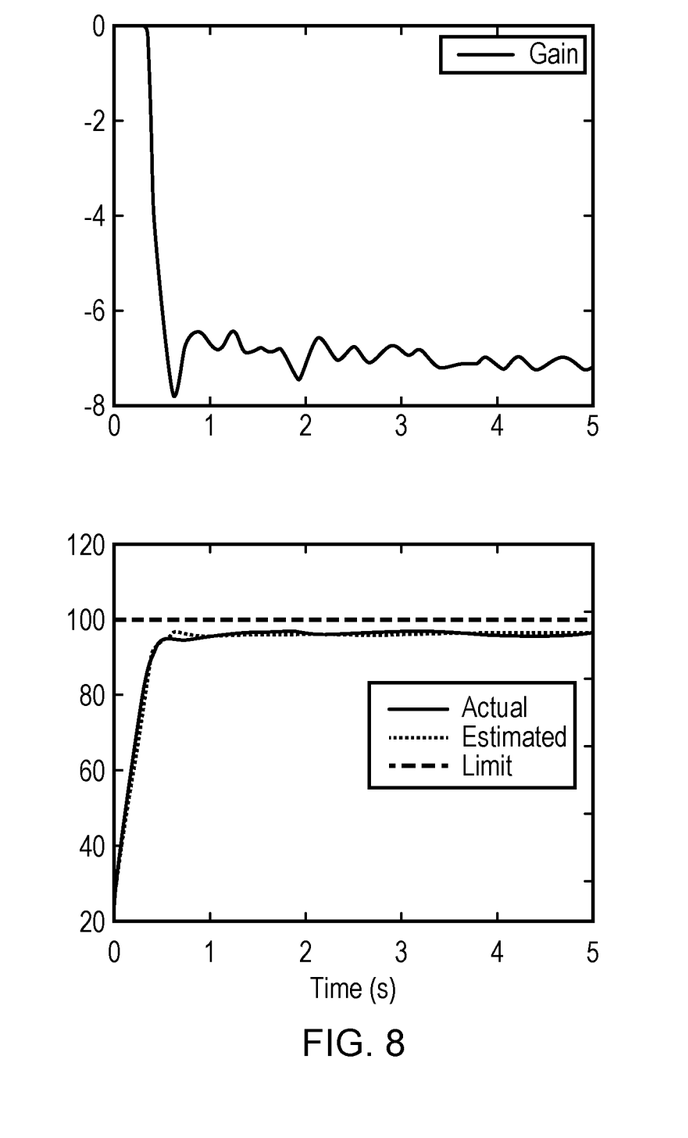
FIG. 8 shows example plots that show simulation results of the thermal protection system with the thermal model based estimator in accordance with embodiments described herein.

FIG. 8 illustrates simulation results of the thermal protection system with the thermal model based estimator 600. As in FIGS. 4a and 4b before, this response is the system response of a full-scale heating tone. The estimated temperature signal $T_E$ output by the thermal model based estimator 600 tracks the actual temperature much better than the system without the thermal model based estimator 600. As a result of the reduced delay, the system has better phase margin and does not suffer the same levels of overshoot and ringing. Also, the only way to previously achieve this fast tracking of the temperature was to reduce the amount of low pass filtering, as in FIG. 4a. However, as previously described, the reduction in low pass filtering had a consequence of high noise levels in the estimated temperature and subsequent large fluctuations in the gain. With the thermal model based estimator 600, however, good noise immunity may be achieved, and the actual temperature T may be tracked. As a result, the gain fluctuations may be small enough that they do not cause audible distortion.

Figure 9:
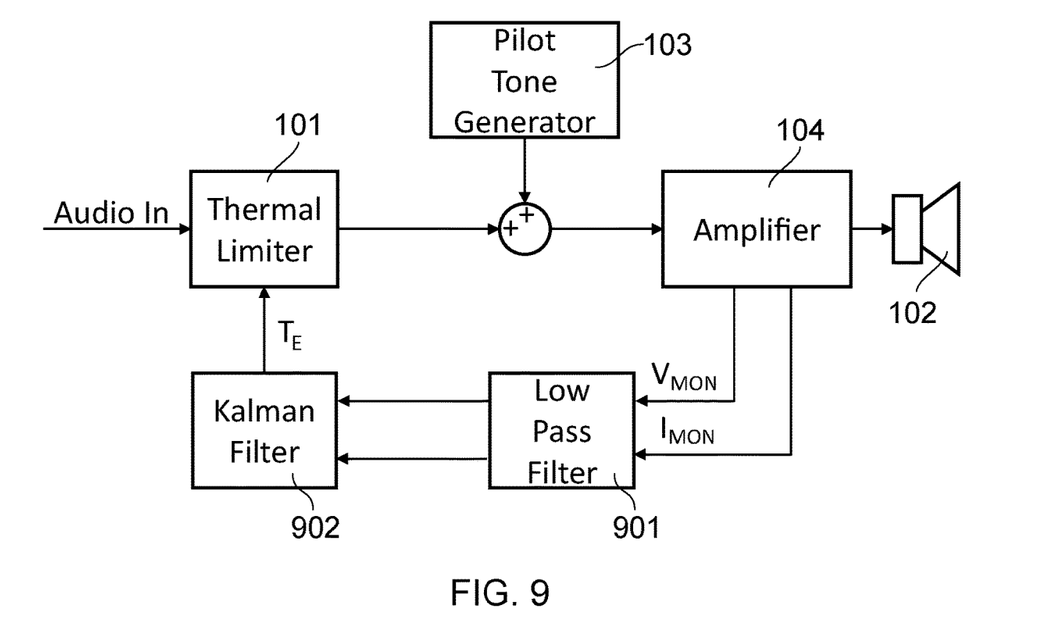
FIG. 9 is an example block diagram of an alternative implementation of the thermal model based estimator in accordance with embodiments described herein.

FIG. 9 illustrates an example block diagram of an alternative implementation of the thermal model based estimator.

In this example, the temperature measurement block may not be needed. The thermal model based estimator 902 operates directly on low pass filtered versions of the measured current $I_{MON}$ and measured voltage $V_{MON}$ signals to form the estimated temperature signal $T_E$. In other words, the first signal comprises the measured voltage signal $V_{MON}$ or a low pass filtered version of the measured voltage signal $V_{MON}$.

By removing the temperature measurement block, the overall algorithm may be simplified. Additionally, there is no need to model the low pass filter effects of the temperature measurement block in the thermal model based estimator 902. This simplification lowers the order of the thermal model based estimator 902 and simplifies the calculations.

However, a low pass filter 901 may still be needed to filter $I_{MON}$ and $V_{MON}$ to filter out frequencies where transducer impedance is larger than the estimated transducer resistance Re. Without the low pass filters, signal content at higher frequencies may cause errors in the adaptation of the estimated transducer resistance Re. If necessary, the effects of these low pass filters may be modelled in the thermal model based estimator 902 (not shown in figure), but the cut-off frequency in the low pass filter 901 may be high enough that this may be unnecessary. The thermal model based estimator 902 (e.g., such as a Kalman Filter) uses the low pass filtered voltage and the low pass filtered current to provide the estimated temperature signal $T_E$.

Figure 10:
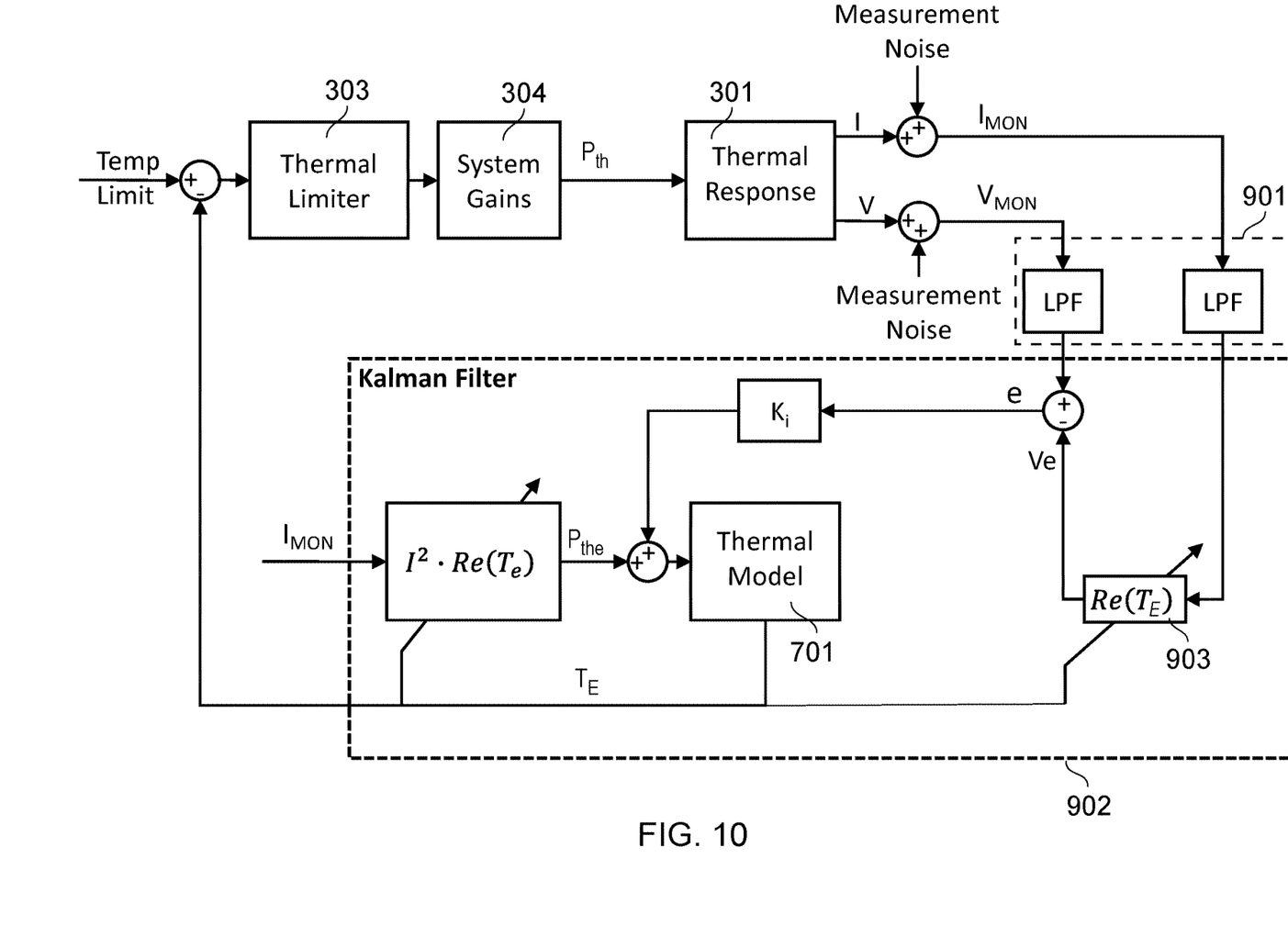
FIG. 10 is an example block diagram of how the thermal model based estimator may be implemented, for example as a Kalman filter in accordance with embodiments described herein.

FIG. 10 illustrates an example of how the thermal model based estimator 902 may be implemented, for example, as a Kalman filter. The thermal model based estimator 902 uses the estimated thermal power $P_{the}$, a transducer thermal model 701 and the low pass filtered measured voltage $V_{MON}$ to provide the estimated temperature signal $T_E$.

Similarly to FIG. 7, the thermal model based estimator 902, which in this case is a Kalman filter, comprises a transducer thermal model 701 configured to mirror the transducer thermal response 301. However, in this example, the thermal model based estimator 902 comprises a voltage estimator 903, configured to provide an estimated voltage Ve as the second signal, based on the estimated temperature signal $T_E$.

Similar to FIG. 7, the thermal model based estimator 902 calculates an estimated thermal power, $P_{the}$, using the measured current $I_{MON}$ and an adapted estimate of the estimated transducer resistance Re based on the estimated temperature signal. The estimated temperature signal $T_E$ is used to update the estimated direct current resistance Re used to derive an estimated thermal power $P_{the}$ that is an input to the transducer thermal model 701.

The voltage estimator 903 therefore takes the estimated coil resistance $Re(T_E)$ and multiples it by the measure current signal $I_{MON}$ to form an estimate of voltage Ve.

The estimated voltage Ve may then be compared to the measured voltage $V_{MON}$. In other words, the estimated voltage Ve may be subtracted from the measured voltage output from the low pass filter 901 to generate an error signal, e.

The error signal e may then be used to adjust the state of the thermal state vector of the thermal model 701. In this example, the Kalman filter may be acting more like a recursive least squares estimator (RLS) of the estimated transducer resistance Re rather than a filter on the measured temperature $T_m$, as was the case in FIG. 7.

The mathematical implementation of the Kalman filter 902 may be similar to the earlier equations but involves lower order terms because the low pass filter is not required. The state update equation may be written as:

$$x_{i+1}=[F_{th}] \cdot [x_{th}]+[B_{th}] \cdot P_{thei}+K_i \cdot (V_{MONi}-Ve_i)$$

where, $V_{MONi}$ is the measured voltage and $Ve_i$ is the Kalman filter estimate of the voltage given by:

$$Ve_i=[f(I_{MONi})] \cdot x_i+g(I_{MONi}),$$

$$H_i=[f(I_{MONi})]$$

where $I_{MONi}$ is the measured current, and the functions $f(I_{MONi})$ and $g(I_{MONi})$ apply the appropriate linear transformation to state vector $x_i$ to extract the estimated resistance Re and multiply it by $I_{MON}$.

The estimated thermal power $P_{thei}$ may be calculated as described above. The Kalman filter coefficients may also be calculated as described above. In this case, $H_i$ varies with time, and therefore, the Kalman gains may be calculated online.

Also, in general, and applicable to all embodiments above, the thermal model based estimator may comprise one of the following: Kalman filter, Leuenberger observer, and sliding mode observer, and the error signal may be used in one of the following methods: Kalman filter methodology, Leuenberger observer methodology, and sliding mode observer methodology.

Figure 11:
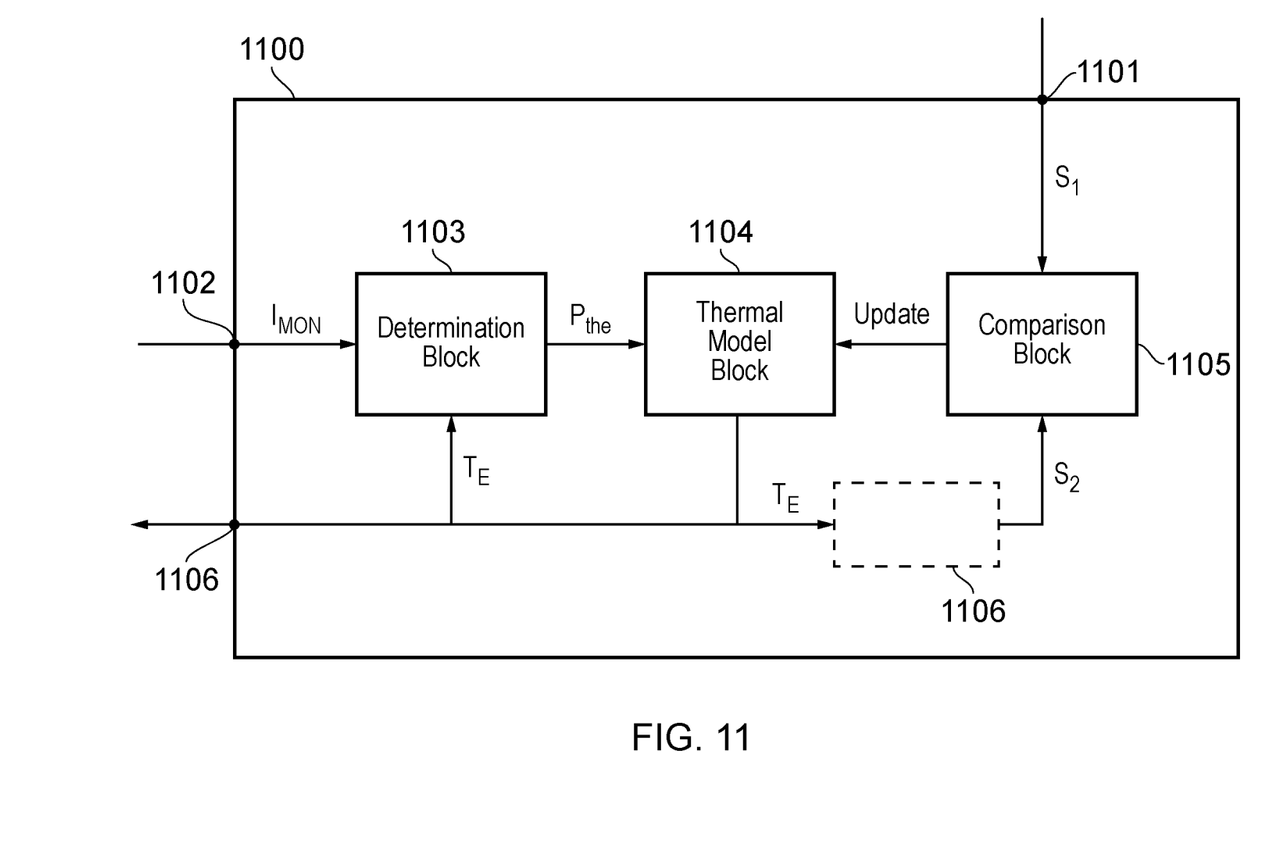
FIG. 11 is an example block diagram of a thermal model based estimator in accordance with embodiments described herein.

FIG. 11 illustrates a thermal model based estimator for estimating a temperature of a transducer.

The thermal model based estimator 1100 comprises a first input 1101 configured to receive a first signal $S_1$ wherein the first signal is representative of an impedance across the transducer. The thermal model based estimator 1100 further comprises a second input 1102 configured to receive an indication of a current across the transducer.

A determination block 1103 is configured to determine an estimated thermal power $P_{the}$ based on the indication of the current $I_{MON}$ and an estimated temperature signal $T_E$.

A thermal model block 1104 is configured to determine, based on the estimated thermal power, the estimated temperature signal $T_E$ using a thermal model of the transducer comprising states defined by a thermal state vector.

A comparison block 1105 is configured to compare the first signal St with a second signal S2 derived from the estimated temperature signal $T_E$, and update the thermal state vector of the thermal model based on the comparison. The second signal S2 may be derived from the estimated temperature signal $T_E$ by a processing block 1106.

The thermal model based estimator then further comprises an output 1106 configured to output the estimated temperature signal. Small pilot tone levels, large amplifier gains, and low resolution ADCs make it difficult to design a thermal protection control loop with adequate noise rejection and ample phase margin. Embodiments disclosed herein make use of a thermal model based estimator, for example a Kalman filter, to alleviate these performance issues. The thermal model based estimator may use a model of the thermal system and a model of any applied low pass filtering in the system to provide a low latency, low noise estimate of the coil temperature in a statistically optimal way.

It should be understood-especially by those having ordinary skill in the art with the benefit of this disclosure that the various operations described herein, particularly in connection with the figures, may be implemented by other circuitry or other hardware components. The order in which each operation of a given method is performed may be changed, and various elements of the systems illustrated herein may be added, reordered, combined, omitted, modified, etc. It is intended that this disclosure embrace all such modifications and changes and, accordingly, the above description should be regarded in an illustrative rather than a restrictive sense. Similarly, although this disclosure makes reference to specific embodiments, certain modifications and changes can be made to those embodiments without departing from the scope and coverage of this disclosure. Moreover, any benefits, advantages, or solutions to problems that are described herein with regard to specific embodiments are not intended to be construed as a critical, required, or essential feature or element.

Further embodiments likewise, with the benefit of this disclosure, will be apparent to those having ordinary skill in the art, and such embodiments should be deemed as being encompassed herein.

The invention claimed is:

1. A method, in a thermal model based estimator, for estimating a temperature of a transducer, comprising:
    receiving a first signal wherein the first signal is representative of an impedance across the transducer;
    receiving an indication of a current across the transducer;
    determining an estimated thermal power based on the indication of the current and an estimated temperature signal,
    determining, based on the estimated thermal power, the estimated temperature signal using a thermal model of the transducer comprising states defined by a thermal state vector;
    comparing the first signal with a second signal derived from the estimated temperature signal;
    updating the thermal state vector of the thermal model based on the comparison; and
    outputting the estimated temperature signal.

2. The method of claim 1 wherein the first signal comprises a measured temperature determined based on an indication of a voltage across the transducer and the indication of the current across the transducer.

3. The method of claim 2 wherein the measured temperature is received from a first low pass filter.

4. The method of claim 3 wherein the second signal is an output from a second low pass filter configured to filter the estimated temperature signal.

5. The method of claim 4 wherein the second low pass filter is configured to provide the same filtering as the first low pass filter.

6. The method of claim 4, wherein the second low pass filter comprises states defined by a filter state vector, and wherein the method further comprises:
    updating the filter state vector based on the comparison.

7. The method of claim 1 wherein the first signal comprises an indication of a voltage across the transducer.

8. The method of claim 7 wherein the second signal comprises an estimate of the voltage across the transducer based on the indication of the current and the estimated temperature signal.

9. The method of claim 1 wherein the thermal model based estimator comprises one of: a Kalman Filter, a Leuenberger Observer, and a sliding mode observer.

10. The method of claim 1 wherein the step of comparing comprises:
    calculating an error signal as a difference between the first signal and the second signal.

11. The method of claim 10 wherein the step of updating the thermal state vector comprises calculating an updated thermal state vector based on a previous state vector and the error signal multiplied by a gain.

12. The method of claim 1 further comprising inputting the estimated temperature signal into a thermal limiter configured to limit an electrical power or voltage input into the transducer based on the estimated temperature signal.

13. A thermal model based estimator, for estimating a temperature of a transducer, the thermal model based estimator comprising:
    a first input configured to receive a first signal wherein the first signal is representative of an impedance across the transducer;
    a second input configured to receive an indication of a current across the transducer;
    a determination block configured to determine an estimated thermal power based on the indication of the current and an estimated temperature signal,
    a thermal model block configured to determine, based on the estimated thermal power, the estimated temperature signal using a thermal model of the transducer comprising states defined by a thermal state vector;
    a comparison block configured to compare the first signal with a second signal derived from the estimated temperature signal and update the thermal state vector of the thermal model based on the comparison; and
    an output configured to output the estimated temperature signal.

14. The thermal model based estimator of claim 13 wherein the first signal comprises a measured temperature determined based on an indication of a voltage across the transducer and the indication of the current across the transducer.

15. The thermal model based estimator of claim 14 wherein the measured temperature is received from a first low pass filter.

16. The thermal model based estimator of claim 15 wherein the second signal is an output from a second low pass filter configured to filter the estimated temperature signal.

17. The thermal model based estimator of claim 16 wherein the second low pass filter is configured to provide the same filtering as the first low pass filter.

18. The thermal model based estimator of claim 16, wherein the second low pass filter comprises states are defined by a filter state vector, and wherein the comparison block is further configured to update the filter state vector based on the comparison.

19. The thermal model based estimator of claim 13 wherein the first signal comprises an indication of a voltage across the transducer.

20. The thermal model based estimator of claim 19 wherein the second signal comprises an estimate of the voltage across the transducer based on the indication of the current and the estimated temperature signal.

21. The thermal model based estimator of claim 13 wherein the thermal model based estimator comprises one of: a Kalman Filter, a Leuenberger Observer, and a sliding mode observer.

22. The thermal model based estimator of claim 13 wherein the comparison block is further configured to calculate an error signal as a difference between the first signal and the second signal.

23. The thermal model based estimator of claim 22 wherein the comparison block is configured to update the thermal state vector by calculating an updated thermal state vector based on a previous state vector and the error signal multiplied by a gain.

24. The thermal model based estimator of claim 13 wherein the thermal model based estimator is configured to input the estimated temperature signal into a thermal limiter configured to limit an electrical power or voltage input into the transducer based on the estimated temperature signal.

* * * * *